United States Patent [19]
Fujii

[11] Patent Number: 5,262,356
[45] Date of Patent: Nov. 16, 1993

[54] METHOD OF TREATING A SUBSTRATE WHEREIN THE FLOW RATES OF THE TREATMENT GASES ARE EQUAL

[75] Inventor: Atsuhiro Fujii, Itami, Japan

[73] Assignee: Mitsubishi Denki Kabushiki Kaisha, Tokyo, Japan

[21] Appl. No.: 674,978

[22] Filed: Mar. 26, 1991

[30] Foreign Application Priority Data

May 23, 1990 [JP] Japan .................................. 2-132996

[51] Int. Cl.$^5$ .................. G01L 21/00; G01L 21/02; G01L 21/302; G01L 21/463
[52] U.S. Cl. .................. 437/225; 437/235; 437/238; 437/240; 118/715; 427/255.1; 427/255.2; 427/255.3
[58] Field of Search ............... 437/225, 228, 235, 238, 437/240, 255.1, 255.2, 255.3; 148/DIG. 118; 118/715

[56] References Cited

U.S. PATENT DOCUMENTS

| | | | |
|---|---|---|---|
| 4,100,310 | 7/1978 | Ura et al. | 437/240 |
| 4,196,232 | 4/1980 | Schnable | 437/238 |
| 4,217,375 | 8/1980 | Adams | 437/240 |
| 4,369,031 | 1/1983 | Goldman et al. | 118/715 |
| 4,401,507 | 8/1983 | Engle | 437/225 |
| 4,446,168 | 5/1984 | Kato et al. | 437/225 |
| 4,517,220 | 5/1985 | Rose | 118/715 |
| 4,748,135 | 5/1988 | Frijlink | 437/225 |
| 4,791,005 | 12/1988 | Becker et al. | 437/240 |
| 4,812,325 | 3/1989 | Ishihara et al. | 437/225 |
| 4,980,204 | 12/1990 | Fujii et al. | 118/715 |
| 5,160,542 | 11/1992 | Mihira et al. | 118/715 |

FOREIGN PATENT DOCUMENTS

| | | | |
|---|---|---|---|
| 0001622 | 1/1979 | Japan | 118/715 |
| 0135127 | 6/1986 | Japan | 437/240 |
| 0237734 | 10/1987 | Japan | 437/240 |
| 0028227 | 1/1992 | Japan | 118/715 |

OTHER PUBLICATIONS

Sze, VLSI Technology, McGraw-Hill, 1988, p. 249.

*Primary Examiner*—Brian E. Hearn
*Assistant Examiner*—B. Everhart
*Attorney, Agent, or Firm*—Leydig, Voit & Mayer

[57] ABSTRACT

A method of treating a substrate with substantially equal flow rates of treatment gases in a treatment chamber containing the substrate. Because the times during which the treatment gases pass through pipes are controlled, even when the flow rates of the treatment gases differ appreciably, the impurity concentration in a film near the interface between the substrate and the film reaches a desired concentration. Also, when the times during which the treatment gases pass through the pipes are short, the treatment gases are unlikely to adhere to the walls of the pipes. It is thus possible to reduce the frequency of dummy runs.

17 Claims, 5 Drawing Sheets

METHOD OF TREATING A SUBSTRATE WHEREIN THE FLOW RATES OF THE TREATMENT GASES ARE EQUAL

BACKGROUND OF THE INVENTION

1. Field of the Invention

The present invention relates to a method of treating a substrate and, more particularly, to a method of treating a substrate by using two or more gases whose flow rates differ appreciably.

2. Description of the Related Art

FIG. 7 is a schematic view showing conventional CVD equipment. The structure of the conventional CVD equipment will be described with reference to FIG. 7.

The CVD equipment has a chamber 1 and a gas introducing pipe 7. A susceptor 3 is placed in the chamber 1. A semiconductor substrate 5 rests on the main surface of the susceptor 3. The gas introducing pipe 7 is arranged in the chamber 1, and extends from the inside of the chamber 1 to the outside of the chamber 1. Gases used for forming a thin film are fed into the chamber 1 via a terminal end 15 of the gas introducing pipe 7. A gas outlet pipe 9 also extends from the inside to the outside of the chamber 1. The gases which have been fed into the chamber 1 are discharged through the gas outlet pipe 9.

The gas introducing pipe 7 is branched at a diverging section 19 into an $O_2$ gas introducing pipe 20a, a $SiH_4$ gas introducing pipe 20b, a $PH_3$ gas introducing pipe 20c, and a $B_2H_6$ gas introducing pipe 20d. When a PSG (phosphosilicate glass) film is formed on the substrate 5, $O_2$ gas, $SiH_4$ gas and $PH_3$ gas are utilized. On the other hand, when a BPSG (boro-phospho silicate glass) film is formed on the substrate 5, $O_2$ gas, $SiH_4$ gas, $PH_3$ gas, and $B_2H_6$ gas are utilized. The $O_2$ gas introducing pipe 20a, the $SiH_4$ gas introducing pipe 20b, the $PH_3$ gas introducing pipe 20c, and the $B_2H_6$ gas introducing pipe 20d are respectively provided with mass flow controllers (MFCs) 17a, 17b, 17c, and 17d. These MFCs 17a, 17b, 17c, and 17d control the flow rates of the gases.

A valve 11 is attached to the gas introducing pipe 7 between a terminal end 15 of the pipe 7 in the chamber 1 and the diverging section 19. An $O_2$ gas-containing cylinder is affixed to an initial end 13a of the $O_2$ gas introducing pipe 20a; a $SiH_4$ gas-containing cylinder is affixed to an initial end 13b of the $SiH_4$ gas introducing pipe 20b; a $PH_3$ gas-containing cylinder is affixed to an initial end 13c of the $PH_3$ gas introducing pipe 20c; and a $B_2H_6$ gas-containing cylinder is affixed to an initial end 13d of the $B_2H_6$ gas introducing pipe 20d. Valves 52a-52d are affixed between the initial ends 13a-13d and the gas cylinders.

The longitudinal sectional areas of the hollow portions of the gas introducing pipe 7, the $O_2$ gas introducing pipe 20a, the $SiH_4$ gas introducing pipe 20b, the $PH_3$ gas introducing pipe 20c, and of the $B_2H_6$ gas introducing pipe 20d are all the same. The distances between the initial end 13a of the $O_2$ gas introducing pipe, 20a and the terminal end 15 of the gas introducing pipe 7 the initial end 13b of the $SiH_4$ gas introducing pipe 20b and the terminal end 15 of the gas introducing pipe 7, the initial end 13c of the $PH_3$ gas introducing pipe 20c and the terminal end 15 of the gas introducing pipe 7, and the initial end 13d of the $B_2H_6$ gas introducing pipe 20d and the terminal end 15 of the gas introducing pipe 7, are all substantially the same.

The operation of the conventional CVD equipment will be explained with reference to FIG. 7. First, the inside of the chamber 1 is filled with $N_2$ gas. The $N_2$ gas is fed into the chamber 1 through a gas pipe which is not shown. The semiconductor substrate 5 placed on the main surface of the susceptor 3. The valve 11 is opened to feed the $O_2$ gas, $SiH_4$ gas, $PH_3$ gas, and the $B_2H_6$ gas to the $O_2$ gas introducing pipe 20a, the $SiH_4$ gas introducing pipe 20b, the $PH_3$ gas introducing pipe 20c, and the $B_2H_6$ gas introducing pipe 20d, respectively. The $O_2$ gas, $SiH_4$ gas, $PH_3$ gas, and the $B_2H_6$ are fed into the chamber 1 via the terminal end 15 of the gas introducing pipe 7. Thus, a BPSG film is formed on the main surface of the semiconductor substrate 5. Gas which has not been used for the reaction is discharged outside the chamber 1 through the gas outlet pipe 9.

For example, when a PSG film is formed, the flow rate of the $O_2$ gas is 2000 cc/min; that of the $SiH_4$ gas is 50 cc/min; and that of $PH_3$ gas is 2 cc/min. The flow rate of the $SiH_4$ gas appreciably differs from that of the $PH_3$ gas. Consequently, there is a marked difference between the time required for the $SiH_4$ gas to reach the inside of the chamber 1 after the feeding of it has begun, and the time required for the $PH_3$ gas to reach the inside of the chamber 1 after the feeding of it has begun. This results in a problem in that the concentration of P in the PSG film near the interface between the semiconductor substrate 5 and the PSG film does not reach a desired concentration.

Moreover, because $PH_3$ gas adheres to the inner wall of a pipe, the amount of the $PH_3$ gas adhering to the inner wall of the pipes must be made equal to the amount of the $PH_3$ gas not adhering to the inner wall of the pipe before the concentration of P in a PSG film can reach a desired concentration. This leads to a problem in that it is necessary to form a thin film, one to five times, in order to render the amount of of the $PH_3$ gas adhering to the inner wall of the pipe equal to the amount of the $PH_3$ gas not adhering to the inner wall of the pipe. Such a process for forming a thin film is referred to as a dummy run.

SUMMARY OF THE INVENTION

The present invention has been accomplished in order to solve the above problems. Accordingly, the object of the invention is to provide a method of treating a substrate in which the impurity concentration in a film near the interface between the substrate and the film can reach a desired concentration, and in which the frequency of dummy runs can be reduced.

In order to achieve the above object, according to one aspect of the invention, there is provided a method of treating a substrate comprising the steps of: housing a substrate in a treatment chamber; controlling a plurality of treatment gases so as to make the flow rates of the treatment gases equal when the treatment gases are being introduced into the treatment chamber; and treating the substrate with the treatment gases.

DESCRIPTION OF THE PREFERRED EMBODIMENTS

First Embodiment

Figure 1:
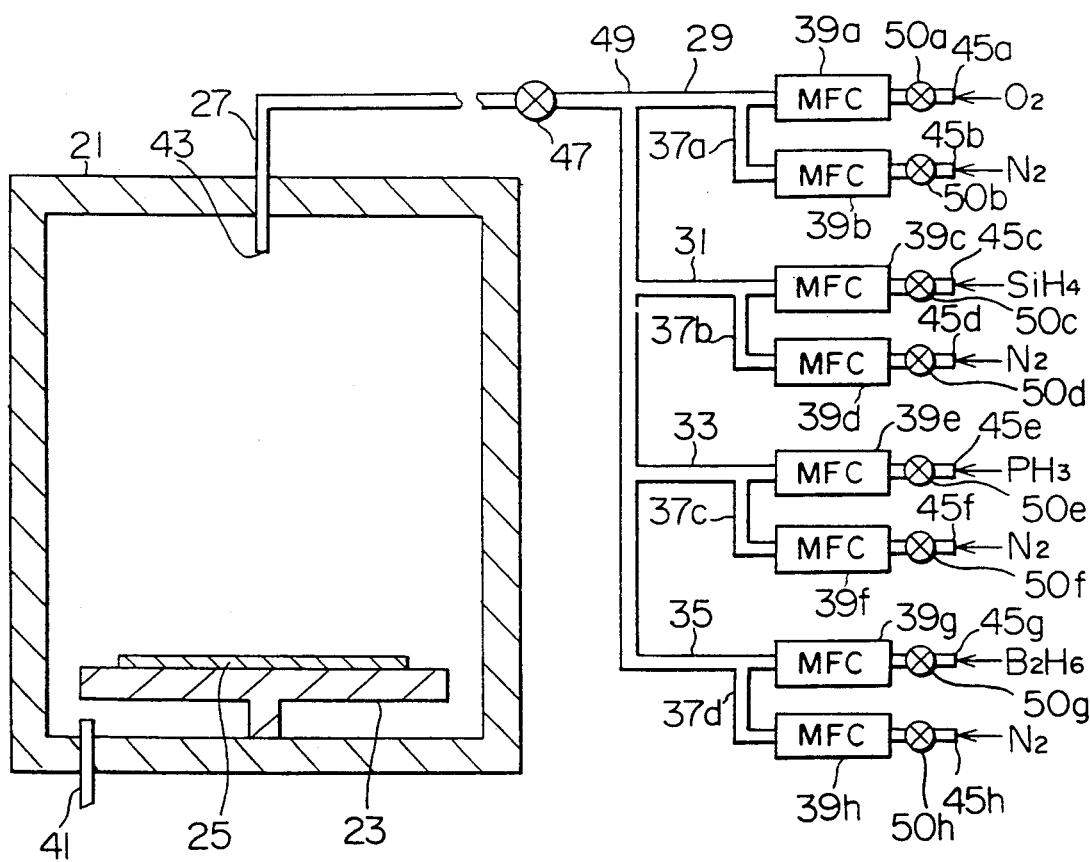
FIG. 1 is a schematic illustration showing CVD equipment which is used for carrying out a first embodiment of the present invention.

FIG. 1 is a schematic illustration showing CVD equipment which is used for carrying out the first embodiment of a method of treating a substrate in accordance with the present invention. The construction of the CVD equipment shown in FIG. 1 will be described.

A susceptor 23 is placed inside a chamber 21. A semiconductor substrate 25 is disposed on the main surface of the susceptor 23. A gas introducing pipe 27 extends from the inside of the chamber 21 to the outside of the chamber 21. A gas outlet pipe 41 also extends from the inside of the chamber 21 to the outside of the chamber 21.

The gas introducing pipe 27 is branched at a diverging section 49 into an $O_2$ gas introducing pipe 29, a $SiH_4$ gas introducing pipe 31, a $PH_3$ gas introducing pipe 33, and a $B_2H_6$ gas introducing pipe 35. A valve 47 is attached to the gas introducing pipe 27 between a terminal end 43 of the pipe 27 in the chamber 21 and the diverging section 49.

The $O_2$ gas introducing pipe 29, the $SiH_4$ gas introducing pipe 31, the $PH_3$ gas introducing pipe 33, and the $B_2H_6$ gas introducing pipe 35 are respectively provided with mass flow controllers (MFCs) 39a, 39c, 39e, and 39g. These MFCs control the flow rates of gases.

A $N_2$ gas introducing pipe 37a is branched off from the $O_2$ gas introducing pipe 29. A mass flow controller 39b is attached to the $N_2$ gas introducing pipe 37a. A $N_2$ gas introducing pipe 37b is branched off from the $SiH_4$ gas introducing pipe 31. A mass flow controller 39d is attached to the $N_2$ gas introducing pipe 37b. A $N_2$ gas introducing pipe 37c is branched off from the $PH_3$ gas introducing pipe 33. A mass flow controller 39f is attached to the $N_2$ gas introducing pipe 37c. A $N_2$ gas introducing pipe 37d is branched off from the $B_2H_6$ gas introducing pipe 35. A mass flow controller 39h is attached to the $N_2$ gas introducing pipe 37d. Valves 50a–50h are affixed between initial ends 45a–45h and gas cylinders (not shown).

The distances between the initial end 45a of the $O_2$ gas introducing pipe 29 and the terminal end 43, the initial end 45b of the $N_2$ gas introducing pipe 37a and the terminal end 43, the initial end 45c of the $SiH_4$ gas introducing pipe 31 and the terminal end 43, the initial end 45d of the $N_2$ gas introducing pipe 37b and the terminal end 43, the initial end 45e of the $PH_3$ gas introducing pipe 33 and the terminal end 43, the initial end 45f of the $N_2$ gas introducing pipe 37c and the terminal end 43, the initial end 45g of the $B_2H_6$ gas introducing pipe 35 and the terminal end 43, and the initial end 45h of the $N_2$ gas introducing pipe 37d and the terminal end 43 are all substantially the same. Also, the longitudinal sectional areas of the hollow portions of the gas introducing pipe 27, the $O_2$ gas introducing pipe 29, the $SiH_4$ gas introducing pipe 31, the $PH_3$ gas introducing pipe 33, the $B_2H_6$ gas introducing pipe 35, and of the $N_2$ gas introducing pipes 37a, 37b, 37c and 37d are all the same.

For example, for the following, let it be assumed that the longitudinal sectional area of the hollow portion of each pipe is 0.3 cm$^2$, and that the distance between the initial end of each pipe and the terminal end 43 is 200 cm. Then, when the flow rate of the $O_2$ gas is 1000 cc/min, the flow rate of the $SiH_4$ gas is 100 cc/min, and the flow rate of the $PH_3$ gas is 10 cc/min, when a PSG film is formed, the times during which the gases pass through the pipes are as follows:

0.06 min for the $O_2$ gas,
0.6 min for the $SiH_4$ gas, and
6 min for the $PH_3$ gas.

In the first embodiment, the flow rate of the gas passing through the $O_2$ gas introducing pipe 29, the flow rate of the gas passing through the $SiH_4$ gas introducing pipe 31, and the flow rate of the gas passing through the $PH_3$ gas introducing pipe 33 are made equal by feeding 900 cc/min of the $N_2$ gas into the $N_2$ gas introducing pipe 37b, and 990 cc/min of the $N_2$ gas into the $N_2$ gas introducing pipe 37c. The times during which the $O_2$ gas, the $SiH_4$ gas, and the $PH_3$ gas pass through the pipes are thus made equal. In other words, in the first embodiment, in order to control the times during which the gases pass through the pipes, $N_2$ gas is fed into the $N_2$ gas introducing pipes 37a, 37b, 37c, and 37d.

The first embodiment of the present invention will be described below in more detail. First, the inside of the chamber 21 was filled with $N_2$ gas. The $N_2$ gas is then fed into the chamber 21 through a gas pipe which is not shown. The semiconductor substrate 25 was disposed on the main surface of the susceptor 23, and the temperature of the semiconductor substrate 25 was raised to a temperature at which a PSG film is formed. The valve 47 was opened to feed 900 cc/min of $N_2$ gas into the $N_2$ gas introducing pipe 37b, and to feed 990 cc/min of $N_2$ gas into the $N_2$ gas introducing pipe 37c. Thereafter, 1000 cc/min of $O_2$ gas was fed into the $O_2$ gas introducing pipe 29, 100 cc/min of $SiH_4$ gas was fed into the $SiH_4$ gas introducing pipe 31, and 10 cc/min of $PH_3$ gas was fed into the $PH_3$ gas introducing pipe 33. A PSG film was formed on the main surface of the semiconductor substrate 25. The concentration of P in this PSG film was 5%. Gas which has not been used for the reaction was discharged through the gas outlet pipe 41. The concentration of P in the PSG film was measured, this film being formed through the use of the first embodiment of the present invention. Various measuring methods, such as an XPS (X-ray photoelectro spectral analysis) and an SIMS (secondary ion mass spectrometric analysis), may be used.

Figure 2:
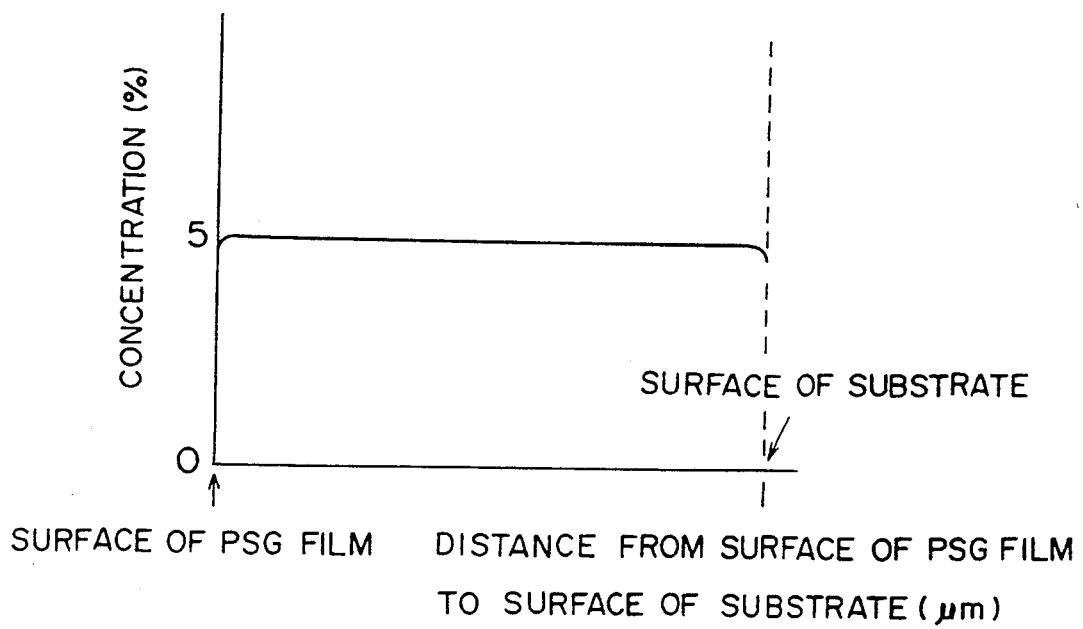
FIG. 2 is a graph of the relationship between position and impurity concentration in a thin film formed using the first embodiment of the invention.
Figure 3:
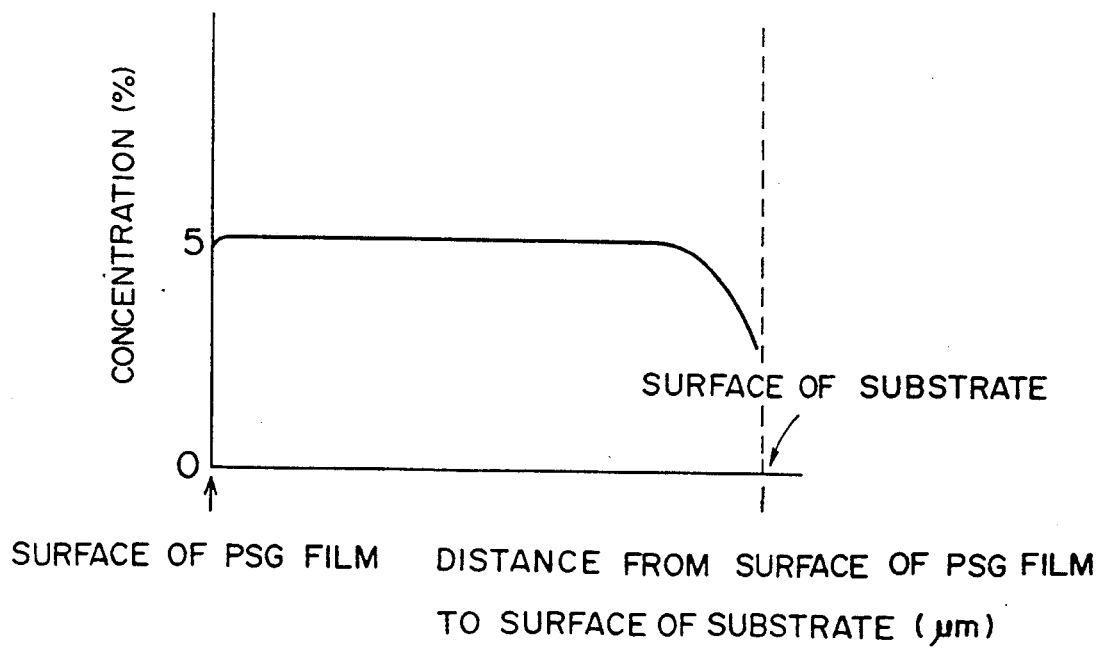
FIG. 3 is a graph of the relationship between position and impurity concentration in a thin film, formed by a conventional method.

FIG. 2 shows the measured results of the concentration of P. The concentration of P in a PSG film made according to this embodiment was measured. FIG. 3 illustrates the measured results of the concentration of P using the conventional method. Conditions under which the first embodiment of the invention were carried out are the same as those for the conventional example, except that $N_2$ gas is introduced. As shown in FIG. 2, in accordance with the first embodiment of the invention, the concentration of P in the PSG film was 5% throughout the depth of the film, from the surface of the PSG film to the surface of the substrate 25. On the other hand, as illustrated in FIG. 3, according to the conventional example, the concentration of P in the PSG film did not reach 5% in the proximity of the surface of the substrate 25.

Figure 4:
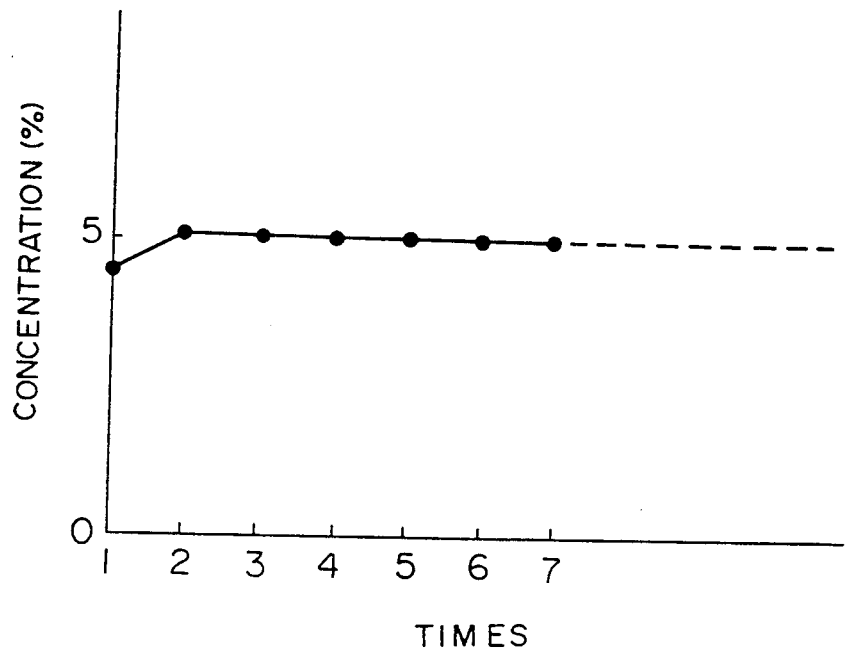
FIG. 4 is a graph showing the relationship between the number of times thin films are formed using the first embodiment of the invention and impurity concentration in the films.
Figure 5:
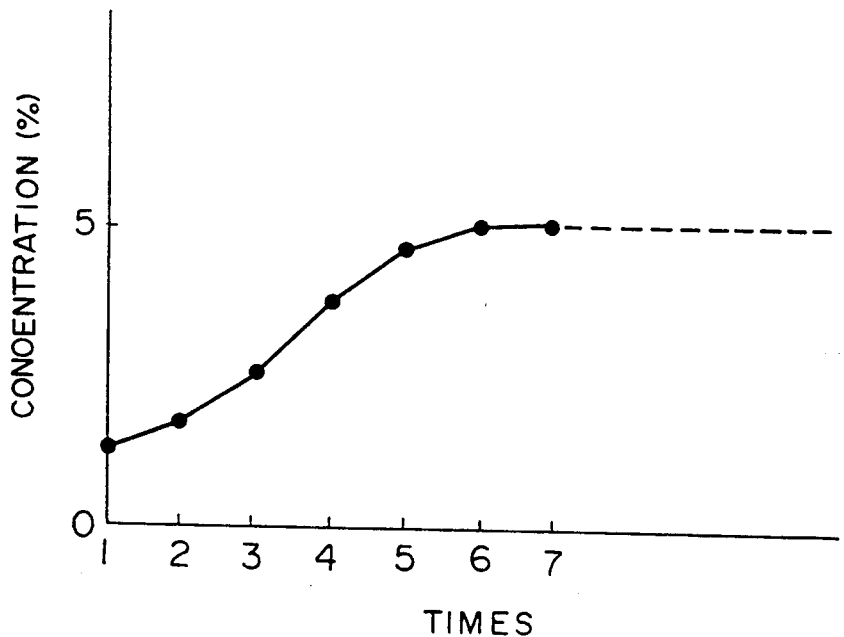
FIG. 5 is a graph showing the relationship between the number of times thin films are formed using the conventional method and impurity concentration in the films.

Next, the first embodiment of the present invention was employed to clean the pipes, and a PSG film was formed on the semiconductor substrate 25. The semiconductor substrate 25 was then taken out of the chamber 1. Another semiconductor substrate was placed in the chamber 1, and the first embodiment of the invention was employed to form another PSG film on the semiconductor substrate. The above procedure was repeated seven times in succession. A measurement was made of the concentration of P in every PSG film which was formed. FIG. 4 shows the measured results of the concentration of P using the method of the invention. The conventional method was then employed to perform the same procedure as above. FIG. 5 shows the results of the concentration of P which were measured using the conventional method. The conditions under which a PSG film was formed in the first embodiment and the conventional method were the same as above.

As is clear from FIG. 4, according to the first embodiment of this invention, it was found that the concentration of P in the PSG films nearly reaches the desirable concentration of 5% the first time, and that it attained the desirable concentration the second time. On the contrary, as shown in FIG. 5, in the conventional method, the concentration of P in the PSG films did not reach the desired concentration until the PSG film was formed the sixth time. In the first embodiment of the invention, since $PH_3$ and $SiH_4$ gases were diluted with $N_2$ gas, and since the flow velocity of these gases were caused to increase, the $PH_3$ and $SiH_4$ gases did not adhere to the insides of the pipes. For this reason, the concentration of P in the PSG films reached the desired concentration from the first time. In accordance with the first embodiment of the invention, it is thus possible to eliminate unuseable wafers and to reduce the frequency of cleaning the pipes.

In the first embodiment of the present invention, the time during which the various raw gases pass through the pipes is controlled with $N_2$ gas so as to make the flow rates of the gases equal. This invention, however, is not limited to such control. The times during which the gases pass through the pipes may also be controlled by changing one of the following factors: the length of each pipe, the longitudinal sectional area of the hollow portion of each pipe, or the concentration of each gas. The times may also be controlled by changing two or more of the above factors at the same time.

Though $N_2$ gas is employed in the first embodiment of the invention, the invention is not limited to $N_2$ gas. Any gas, such as an inert gas, may also be employed so long as it exhibits inert characteristics at the temperature at which a thin film is formed.

Furthermore, although a CVD process is utilized in the first embodiment of the invention, the invention is not limited to such a process. This invention may also be applied in a case when etching is performed by gases, the flow rates of these gases being greatly different.

Second Embodiment

Figure 6:
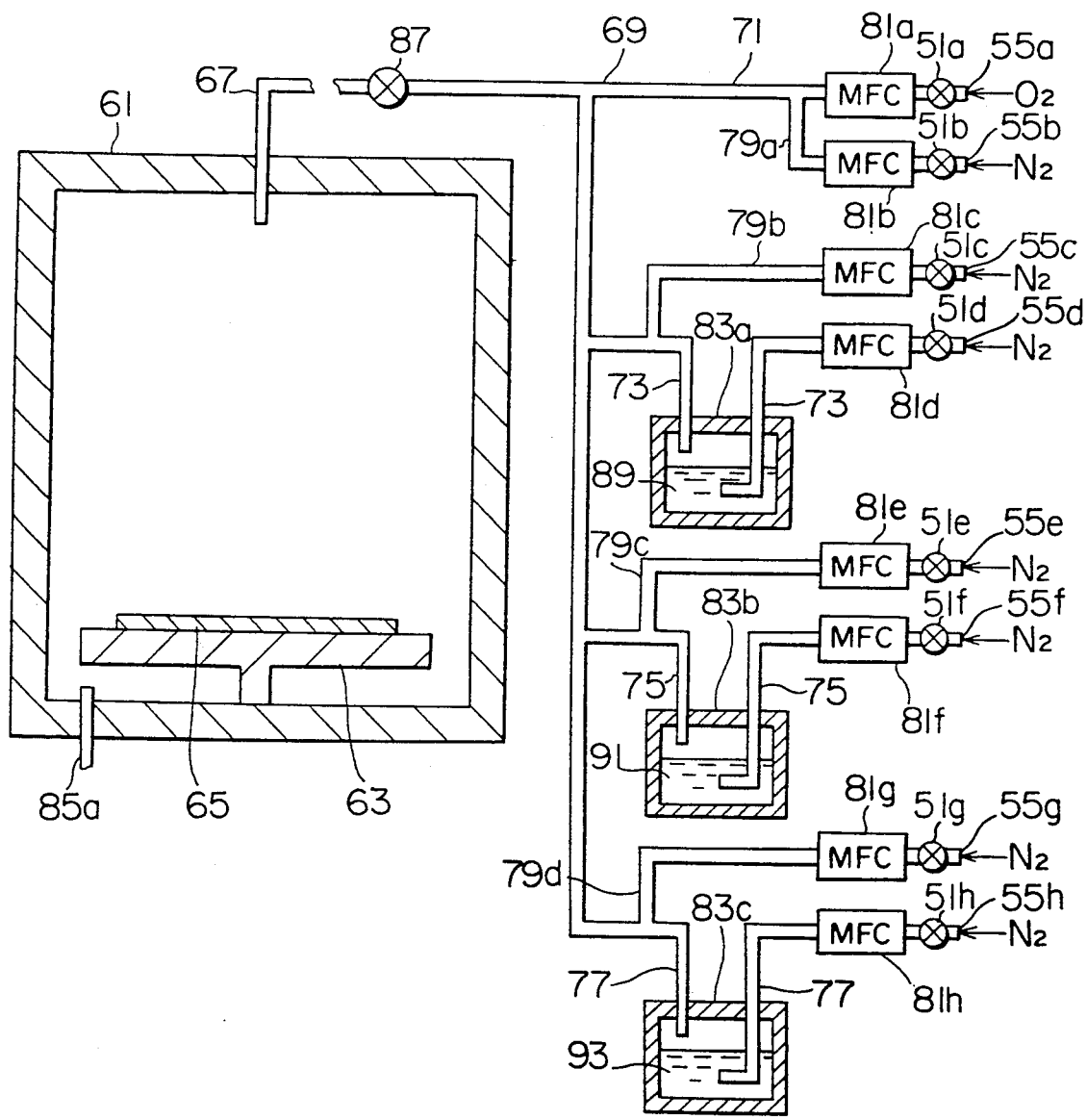
FIG. 6 is a schematic illustration showing CVD equipment which is used for carrying out a second embodiment of this invention.
Figure 7:
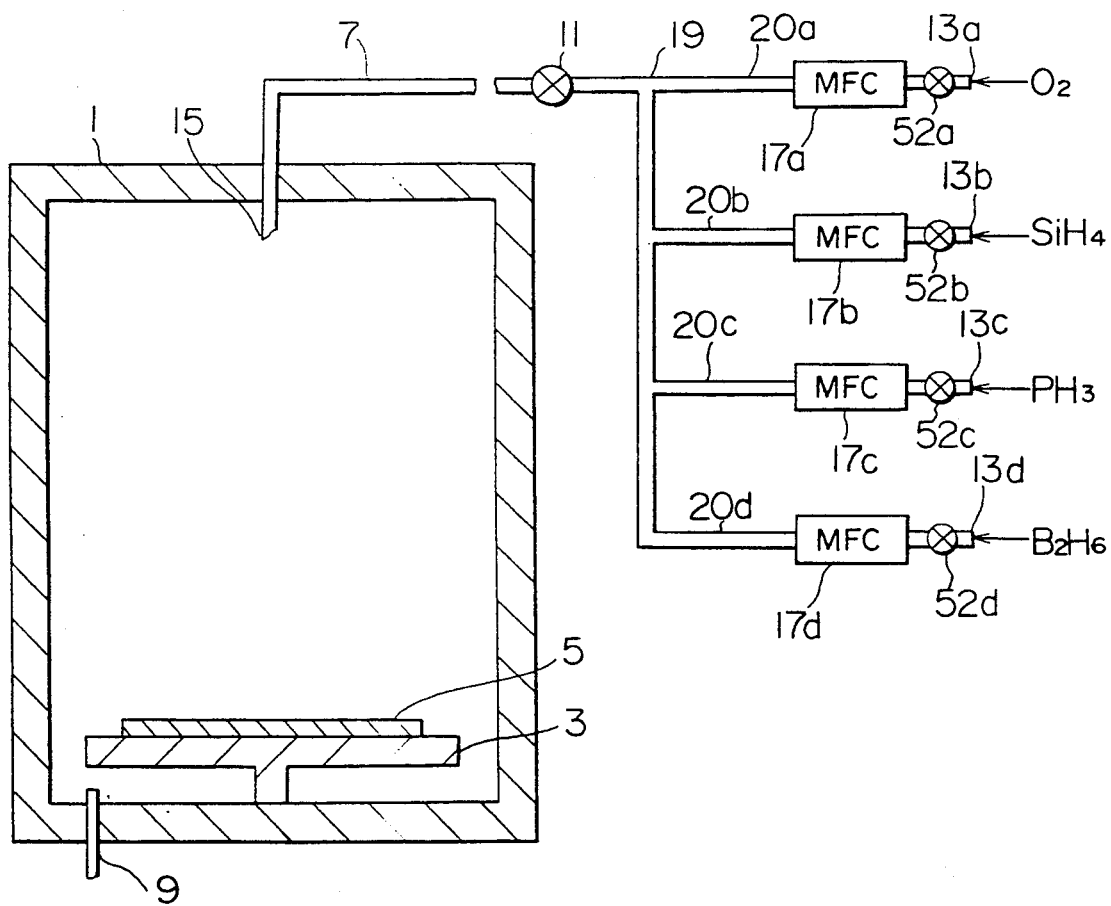
FIG. 7 is a schematic representation showing conventional CVD equipment.

A second embodiment of the invention will now be described. FIG. 6 is a schematic illustration showing CVD equipment which is used for carrying out the second embodiment of the invention. The construction of the CVD equipment shown in FIG. 6 will be explained.

A susceptor 63 is placed inside a chamber 61. A semiconductor substrate 65 is disposed on the main surface of the susceptor 63. A gas introducing pipe 67 extends from the inside of the chamber 61 to the outside of the chamber 61. A gas outlet pipe 85a also extends from the inside of the chamber 61 to the outside of the chamber 61.

The gas introducing pipe 67 is branched at a diverging section 69 into an $O_2$ gas introducing pipe 71, a pipe 73 for Si-containing gas, a pipe 75 for P-containing gas, and a pipe 77 for B-containing gas. The $O_2$ gas introducing pipe 71, the pipe 73 for Si-containing gas, the pipe 75 for P-containing gas, and the pipe 77 for B-containing gas are respectively provided with mass flow controllers (MFCs) 81a, 81d, 81f, and 81h. Valves 51a–51h are affixed between initial ends 55a–55h and gas cylinders (not shown).

$N_2$ gas introducing pipes 79a, 79b, 79c, and 79d are respectively connected to the $O_2$ gas introducing pipe 71, the pipe 73 for Si-containing gas, the pipe 75 for P-containing gas, and the pipe 77 for B-containing gas. The time during which the gases pass through the pipes is controlled by feeding the $N_2$ gas into the $N_2$ gas introducing pipes 79a, 79b, 79c, and 79d. Mass flow controllers (MFCs) 81b, 81c, 81e, and 81g are respectively affixed to these $N_2$ gas introducing pipes 79a, 79b, 79c, and 79d.

The pipe 73 for Si-containing gas runs through a bubbling chamber 83a in which a liquid TEOS (Silicon tetraethylorthosilicate:Si $(OC_2H_5)_4$) 89 is contained. The pipe 75 for P-containing gas runs through a bubbling chamber 83b, in which a liquid TMPO (Phosphorus trimethyloxide: $PO(OCH_3)_3$) 91 is contained. The pipe 77 for B-containing gas runs through a bubbling chamber 83c, in which a liquid TEB (Triethyl Borate: B $(OC_2H_5)_3$) 93 is contained.

In the CVD equipment constructed in this manner, a liquid such as TEOS is bubbled with $N_2$ gas, whereby the gas evolved is used to formed a thin film on the semiconductor substrate. By using such CVD equipment, thin films may be obtained whose coverage is better than that of thin films obtained by the conventional CVD equipment.

For example, when a BPSG film is formed (the concentration of B in this film being 5 mole %, and the concentration of P in the film being 5 mole %), the flow rate of the $N_2$ gas which is fed into the pipe 73 for Si-containing gas, the flow rate of the $N_2$ gas which is fed into the pipe 75 for P-containing gas, and the flow rate of the $N_2$ gas which is fed into the pipe 77 for B-containing gas, are as follows:

First, the number of moles of TEOS, the number of moles of TMPO, and the number of moles of TEB which are respectively required for preparing one mole of $SiO_2$, one mole of $P_2O_5$, and one mole of $B_2O_3$ are determined.

Thus, one mole of $SiO_2$ can be prepared with one mole of TEOS.

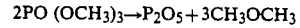

Thus, one mole of $P_2O_5$ can be prepared with two moles of TMPO.

$$2B(OC_2H_5)_3 \rightarrow B_2O_3 + 3C_2H_5OC_2H_5$$

Thus, one mole of $B_2O_3$ can be prepared with two moles of TEB.

Hence, $SiO_2$: $P_2O_5$: $B_2O_3$ = 90 mole %: 5 mole %: 5 mole %

Therefore,

TEOS: TMPO: TEB = 90: 10: 10 = 9: 1: 1

In a gaseous state, since a molar ratio is a flow rate, $$\text{TEOS gas TMPO gas: TEB gas} = 9: 1: 1 \quad (1)$$

The vapor pressures of TEOS, TMPO, and TEB at a temperature of t°C. are expressed as follows:

$$\text{TEOS: } \log_{10} P = 9.651 - 1817.5/(t+225.56) \quad \ldots (2)$$

$$\text{TEOS: } \log_{10} P = 10.170 - 2416/(t+273.15) \quad \ldots (3)$$

$$\text{TEOS: } \log_{10} P = 10.267 - 2061/(t+273.15) \quad \ldots (4)$$

where P is vapor pressure (Pa), one atmospheric pressure being 101325 Pa, whereas t is absolute temperature. The above equations are quoted from a gas catalog issued by Chemical Laboratory Co., Ltd. Aug. 4, 1989.

From equation (2), the vapor pressure of TEOS at 60° C. is obtained as follows:

$$P \approx 1933 \text{ Pa} = 14.5 \text{ mm Hg}$$

Thus, the amount of TEOS gas evolved by bubbling TEOS at 60° C. with 3 l/min of $N_2$ gas is as follows:

$$(14.5 \text{ mm Hg}/760 \text{ mm Hg}) \times 3 \text{ l/min} = 0.0572 \text{ l /min}$$

Therefore, from equation (1), 0.00636 l /min of TMPO gas and of TEB gas must be evolved. The flow rate of $N_2$ gas required for evolving 0.00636 l/min of TMPO gas and of TEB gas is determined as follows:

As regards the flow rate of $N_2$ gas required for bubbling TMPO, from equation (3), the vapor pressure of TMPO at 60° C. is 6.21 mm Hg, thus, $$0.00636 \text{ l/min} = (6.21 \text{ mm Hg}/760 \text{ mm Hg}) \times \text{the flow rate of } N_2 \text{ gas l/min}$$

hence, the flow rate of $N_2$ gas required for bubbling TMPO is 0.778 l/min.

As regards the flow rate of $N_2$ gas required for bubbling TEB, from equation (4), the vapor pressure of TEB at 60° C. is 90.3 mm Hg, thus, $$0.00636 \text{ l/min} = (90.3 \text{ mm Hg}/760 \text{ mm Hg}) \times \text{the flow rate of } N_2 \text{ gas l/min}$$

therefore, the flow rate of $N_2$ gas required for bubbling TMPO is 0.0535 l/min.

Hence, the flow rate of $N_2$ gas to be fed into the pipe 73 for Si-containing gas is 3 l/min; the flow rate of $N_2$ gas to be fed into the pipe 75 for P-containing gas is 0.778 l/min; and the flow rate of $N_2$ gas to be fed into the pipe 77 for B-containing gas is 0.0535 l/min. Thus, the flow rate of the gas passing through the respective pipes differs markedly.

To solve the above problem, in the second embodiment, the following two methods were employed. The first method will be described.

In this method, the flow rates of gas, which passes through the pipe 73 for Si-containing gas, the pipe 75 for P-containing gas, and the pipe 77 for B-containing gas, are made equal by feeding $N_2$ gas into the $N_2$ gas introducing pipes 79b, 79c, and 79d. In such a case, 0 l/min, 2.222 l/min, and 2.9465 l/min of the $N_2$ gas are respectively fed into the $N_2$ gas introducing pipes 79b, 79c, and 79d.

The second method is a method in which the vapor pressures of TEOS, TMPO, and of TEB are controlled, whereby the flow rates of $N_2$ gas used for bubbling are made equal. For instance, as explained above, the amount of TEOS gas, which is evolved by bubbling TEOS at 60° C. with 3 l/min of $N_2$ gas, is 0.0572 l/min. Thus, it is necessary that 0.00636 l/min of TMPO gas and of TEB gas be evolved. Since TEB is bubbled with 3 l/min of $N_2$ gas, the vapor pressure $V_1$ of TMPO and the vapor pressure $V_2$ of TEB are controlled as follows:

As regards TMPO, $$(V_1 \text{ mm Hg}/760 \text{ mm Hg}) \times 3 \text{ l/min} = 0.00636 \text{ l/min},$$

so that $V_1$ is 1.61 mm Hg. When the temperature of TMPO is 35° C., the vapor pressure $V_1$ of TMPO assumes is 1.61 mm Hg from equation (3).

As regards TEB, $$(V_2 \text{ mm Hg}/760 \text{ mm Hg}) \times 3 \text{ l/min} = 0.00636 \text{ l/min},$$

hence, $V_2$ is 1.61 mm Hg. When the temperature of TEB is $-13.4°$ C., the vapor pressure $V_2$ of TEB is 1.61 mm Hg from equation (4).

The second embodiment of the present invention may also be applied in a case where TMOS, TPOS, DADBS, TMP, TMB, TPB, TBB, etc. are utilized to form thin films.

Further, an oxide film or a doped metal film such as p-doped polysilicon can also be formed according to the present invention.

In the present invention, the times during which various gases pass through pipes are so controlled that the flow rates of the gases are equal. Therefore, even when gases whose flow rates appreciably differ are employed to form a thin film, the impurity concentration in a film near the interface between the thin film and the substrate can have a desired concentration. In addition, since the times during which gases pass through pipes are made short, the gases are unlikely to adhere to the walls of the pipes, whereby the frequency of dummy runs can be decreased. It is thus possible to increase the yield in manufacturing semiconductor devices.

What is claimed is:

1. A method of treating a substrate comprising:
   placing a substrate in a treatment chamber;
   separately controlling the flow rates of each of a plurality of treatment gas flows so that the respective flow rates of the treatment gas flows are substantially equal, each treatment gas flow including a respective treatment gas and at least one of the treatment gas flows including a carrier gas;
   mixing the plurality of treatment gas flows;
   introducing the mixed plurality of treatment gas flows into the treatment chamber; and
   treating the substrate with the treatment gas flows introduced into the treatment chamber.

2. A method of treating a substrate as claimed in claim 1 wherein each of the treatment gas flows includes a carrier gas and the respective treatment gas.

3. A method of treating a substrate as claimed in claim 1 including controlling the vapor pressure of at least one treatment liquid, bubbling a carrier gas through the treatment liquid to produce one of the treatment gas flows.

4. A method of treating a substrate as claimed in claim 1 wherein the substrate is a semiconductor substrate.

5. A method of treating a substrate as claimed in claim 1 wherein the treatment gases are oxygen gas, silane gas, and phosphine gas to form a phospho-silicate glass film on the substrate.

6. A method of treating a substrate as claimed in claim 1 wherein the treatment gases are oxygen gas, silane gas, phosphine gas, and borane gas for forming boro-phosphosilicate glass film on the substrate.

7. A method of treating a substrate as claimed in claim 1 including forming an oxide film on the substrate.

8. A method of treating a substrate as claimed in claim 1 including forming a doped film on the substrate semiconductor.

9. A method of treating a substrate as claimed in claim 8 wherein the doped film is p-doped polysilicon.

10. A method of treating a substrate as claimed in claim 1 including selecting the carrier gas from the group consisting of nitrogen and inert gases.

11. A method of treating a substrate as claimed in claim 3 wherein the treatment liquids are selected from the group consisting of tetraethylorthosilicate, phosphorus trimethyloxide, and triethyl borate.

12. A method of treating a substrate as claimed in claim 1 including chemical vapor deposition as the treatment.

13. A method of treating a substrate comprising:
placing a substrate in a treatment chamber;
introducing a plurality of treatment gases into respective pipes connected to sources of the respective treatment gases and to the treatment chamber; and
controlling the times the respective treatment gases travel through the respective pipes from the respective sources to the treatment chamber so that the times are substantially the same for each of the treatment gases.

14. A method of treating a substrate as claimed in claim 13 including controlling the times the respective treatment gases travel through the respective pipe by adding a carrier gas at a controlled flow rate to at least one of the treatment gases.

15. A method of treating a substrate as claimed in claim 13 including controlling the time a treatment gas derived from a liquid source travels through one of the pipes by controlling the flow rate of a carrier gas through the liquid source.

16. A method of treating a substrate as claimed in claim 13 including controlling the time a treatment gas derived from a liquid source travels through one of the pipes by controlling the vapor pressure of the liquid source.

17. A method of treating a substrate as claimed in claim 16 including controlling the time the treatment gas derived from the liquid source travels through one of the pipes by controlling the flow rate of a carrier gas flowing through the liquid source.

* * * * *